(12) United States Patent
Kataoka et al.

(10) Patent No.: US 9,618,412 B2
(45) Date of Patent: Apr. 11, 2017

(54) SEMICONDUCTOR PHYSICAL QUANTITY SENSOR

(71) Applicant: Panasonic Intellectual Property Management Co., Ltd., Osaka (JP)

(72) Inventors: Kazushi Kataoka, Mie (JP); Jun Ogihara, Mie (JP); Naoki Ushiyama, Mie (JP); Hisanori Shiroishi, Mie (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/913,158

(22) PCT Filed: Aug. 8, 2014

(86) PCT No.: PCT/JP2014/004139
§ 371 (c)(1),
(2) Date: Feb. 19, 2016

(87) PCT Pub. No.: WO2015/025496
PCT Pub. Date: Feb. 26, 2015

(65) Prior Publication Data
US 2016/0195446 A1 Jul. 7, 2016

(30) Foreign Application Priority Data

Aug. 21, 2013 (JP) .................................. 2013-170965

(51) Int. Cl.
*G01L 9/00* (2006.01)
*B81B 7/00* (2006.01)
*B81B 3/00* (2006.01)

(52) U.S. Cl.
CPC .......... *G01L 9/0072* (2013.01); *B81B 7/0029* (2013.01); *B81B 3/00* (2013.01)

(58) Field of Classification Search
CPC ... B81B 7/0009; B81B 7/0016; B81B 7/0029; B81B 3/0051; G01L 9/0072; G01L 9/0073; G01L 9/0075
See application file for complete search history.

(56) References Cited

U.S. PATENT DOCUMENTS 5,323,656 A * 6/1994 Fung ................. G01L 9/0073
29/25.41
5,470,797 A * 11/1995 Mastrangelo ......... G01L 9/0073
438/53

(Continued)

FOREIGN PATENT DOCUMENTS

JP H08-320268 A 12/1996
JP H10-160611 A 6/1998

(Continued)

OTHER PUBLICATIONS

International Search Report issued in Application No. PCT/JP2014/004139 dated Nov. 11, 2014, with English translation.

*Primary Examiner* — Bryan Junge
(74) *Attorney, Agent, or Firm* — McDermott Will & Emery LLP

(57) ABSTRACT

A semiconductor physical quantity sensor includes: a first base material; an electrode formed on the first base material; a diaphragm which bends in accordance with a physical quantity applied from the outside; a second base material fixed to the first base material and supporting the diaphragm such that the diaphragm is opposed to the electrode with a space (S) in between; and an insulator formed on a surface on the first base material side of the diaphragm. Moreover, a wall portion to define the space (S) is formed between the insulator and the electrode.

14 Claims, 9 Drawing Sheets

(56) References Cited

U.S. PATENT DOCUMENTS

| | | |
|---|---|---|
| 5,528,452 A | 6/1996 | Ko |
| 5,585,311 A | 12/1996 | Ko |
| 5,801,313 A | 9/1998 | Horibata et al. |
| 6,097,821 A | 8/2000 | Yokoyama et al. |
| 6,109,113 A * | 8/2000 | Chavan .................. B81B 7/007 73/706 |
| 2003/0107868 A1 * | 6/2003 | Chatzandroulis ..... G01L 9/0073 361/303 |
| 2014/0175572 A1 * | 6/2014 | Hsu ....................... B81B 3/0086 257/415 |

FOREIGN PATENT DOCUMENTS

| | | |
|---|---|---|
| JP | H10-509241 A | 9/1998 |
| JP | H10-332511 A | 12/1998 |

\* cited by examiner

SEMICONDUCTOR PHYSICAL QUANTITY SENSOR

RELATED APPLICATIONS

This application is the U.S. National Phase under 35 U.S.C. §371 of International Application No. PCT/JP2014/004139, filed on Aug. 8, 2014, which in turn claims the benefit of Japanese Application No. 2013-170965, filed on Aug. 21, 2013, the disclosures of which are incorporated by reference herein.

TECHNICAL FIELD

The present invention relates to a semiconductor physical quantity sensor.

BACKGROUND ART

There has been heretofore known a semiconductor physical quantity sensor in which an electrode is formed on an upper surface of a substrate and a diaphragm is disposed to be opposed to the electrode with a space in between (for example, see Patent Literature 1).

In this Patent Literature 1, the diaphragm bends in accordance with a physical quantity applied from the outside to change the capacitance of the semiconductor physical quantity sensor, and thus the semiconductor physical sensor is able to detect a change in the physical quantity by detecting the change in the capacitance.

Moreover, an insulator is provided over the electrode formed on the upper surface of the substrate, so that the insulator can check a short circuit due to contact of the electrode with the diaphragm. In this case, the insulator is deformed by a thermal process so that the insulator may not form ridge portions on edges of the electrode, and thus the upper surface of the insulator is made substantially flat.

CITATION LIST

Patent Literature

Patent Literature 1: Published Japanese Translation of PCT International Application No. Hei 10-509241

SUMMARY OF INVENTION

Technical Problem

However, a thickness of the insulator may change due to the thermal process according to the above-described conventional technique. For this reason, it has been difficult to control the thickness of the insulator and hence to enhance detection accuracy.

Accordingly, an object of the present invention is to provide a semiconductor physical quantity sensor capable of enhancing detection accuracy.

Solution to Problem

A first feature of the present invention is summarized as a semiconductor physical quantity sensor including: a first base material; an electrode formed on the first base material; a diaphragm configured to bend in accordance with a physical quantity applied from the outside; a second base material fixed to the first base material and supporting the diaphragm such that the diaphragm is opposed to the electrode with a space in between; and an insulator formed on a surface of the diaphragm, the surface being on the first base material side, wherein a wall portion to define the space is formed between the insulator and the electrode.

A second feature of the present invention is that the wall portion including a projection projecting from at least one of the insulator and the electrode toward the other one of the insulator and the electrode, in summary.

A third feature of the present invention is that the insulator which is a silicon oxide film, in summary.

A fourth feature of the present invention is that the insulator is a silicon nitride film, in summary.

A fifth feature of the present invention is that the electrode is made of a metal material, in summary.

A sixth feature of the present invention is that the electrode is formed by using at least one of materials including chromium, aluminum, a titanium-aluminum alloy, and an aluminum alloy, in summary.

A seventh feature of the present invention is that the electrode comprises: an electrode body opposed to the diaphragm; and an extension portion extending to the outside of the space, in summary.

An eighth feature of the present invention is that the extension portion formed by using at least one of materials including chromium, aluminum, a titanium-aluminum alloy, and an aluminum alloy, in summary.

A ninth feature of the present invention is that the electrode body is made of a material different from a material of the extension portion, in summary.

A tenth feature of the present invention is that the extension portion is provided with an electrode pad made of a material containing aluminum, in summary.

An eleventh feature of the present invention is summarized as a semiconductor physical quantity sensor including: a first base material; an electrode formed on the first base material; a diaphragm configured to bend in accordance with a physical quantity applied from the outside; a second base material fixed to the first base material and configured to support the diaphragm such that the diaphragm is opposed to the electrode with a space in between; and a taking-out electrode pad formed at part of the electrode, wherein the electrode is made of at least one of materials including chromium, aluminum, a titanium-aluminum alloy, and an aluminum alloy, and the electrode pad is made of a material containing aluminum.

A twelfth feature of the present invention is summarized as further including: an insulator formed on a surface of the diaphragm, the surface being on the first base material side, wherein a wall portion to define the space is formed between the insulator and the electrode.

Advantageous Effects of Invention

According to the present invention, it is possible to provide a semiconductor physical quantity sensor capable of enhancing detection accuracy.

DESCRIPTION OF EMBODIMENTS

Embodiments of the present invention will be described below in detail with reference to the drawings. Note that the following embodiments include constituents in common. Accordingly, in the following description, the same constituents will be denoted by common reference signs and overlapping description thereof will be omitted.

First Embodiment

Figure 1:
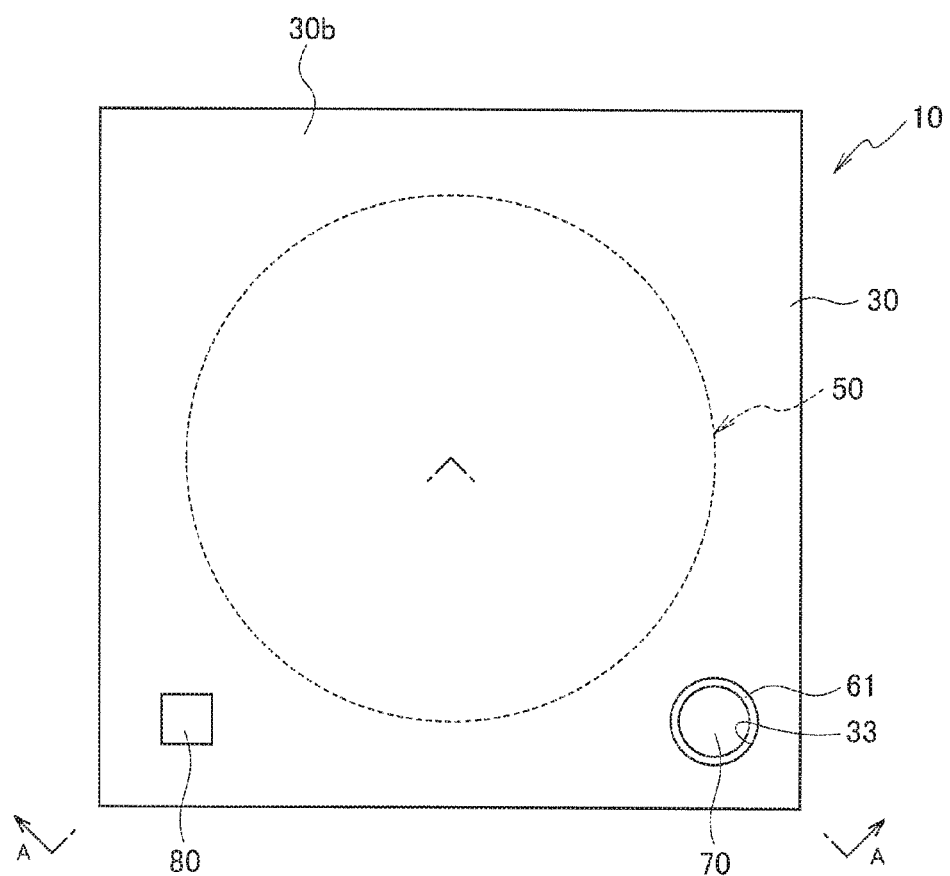
FIG. 1 is a plan view schematically showing a semiconductor physical quantity sensor according to a first embodiment of the present invention.
Figure 2:
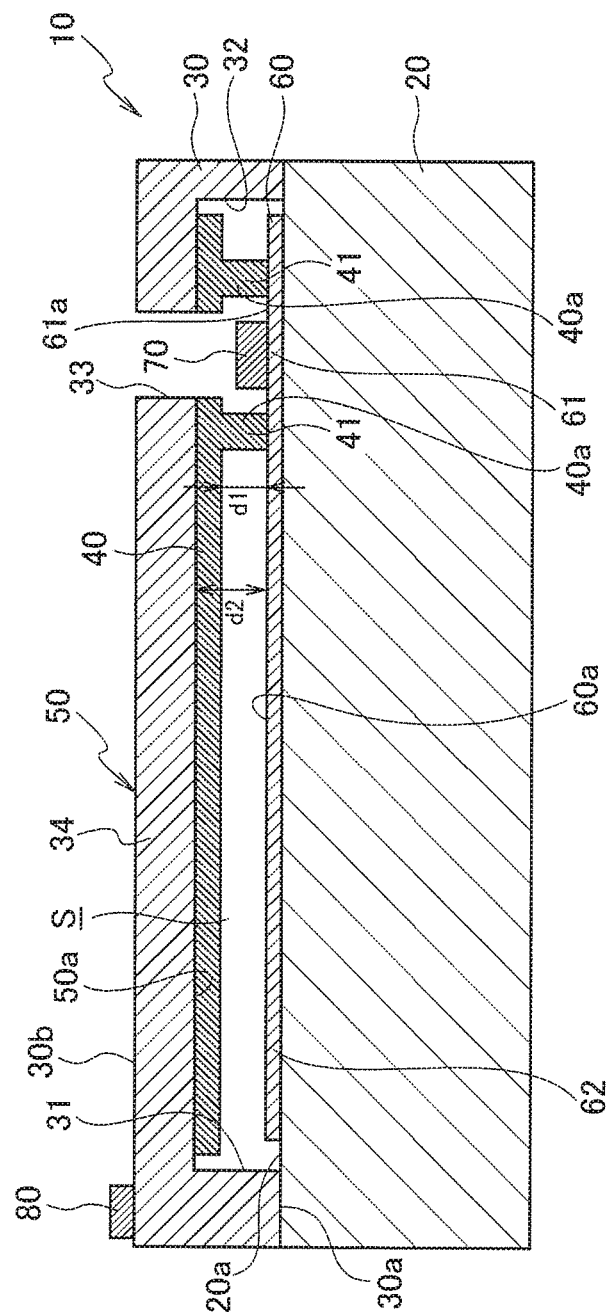
FIG. 2 is a cross-sectional view taken along an A-A line in FIG. 1.

As shown in FIG. 1 and FIG. 2, a semiconductor physical quantity sensor 10 of this embodiment includes a glass substrate (a first base material) 20 in a substantially rectangular plate shape. Moreover, an electrode 60 is formed on an upper surface (a surface to which a second base material is fixed) 20a of the glass substrate 20. The electrode 60 is made of a metal material such as chromium (Cr), a titanium-aluminum alloy (AlTi), and an aluminum alloy (such as AlSi and AlSiCu) (at least one material out of chromium, aluminum, a titanium-aluminum alloy, and an aluminum alloy), and is deposited on the upper surface 20a of the glass substrate 20 in accordance with plasma CVD, reactive sputtering, ion beam sputtering, or the like. The electrode 60 can be deposited in a more uniform thickness by using the plasma CVD, the reactive sputtering, the ion beam sputtering, or the like as described above. Note that materials other than the aforementioned materials can also be used as the material of the electrode 60. Such other materials include metal materials such as gold (Au), and non-metal conductive materials.

In addition, the semiconductor physical quantity sensor 10 includes a semiconductor substrate (the second base material) 30 to be fixedly bonded (fixed) to the glass substrate 20. A lower surface 30a side (another side) of the semiconductor substrate 30 is fixedly bonded (fixed) to the upper surface 20a side (one side) of the glass substrate 20.

The semiconductor substrate 30 is made of single-crystal silicon, and formed to have a rectangular contour shape in planar view. Here, a certain part (which is a lower left corner in FIG. 1) on an upper surface 30b of the semiconductor substrate 30 made of single-crystal silicon is provided with an electrode 80 to take electric potential out of the semiconductor substrate 30. In this case, a high-concentration impurity diffused portion may be preferably formed at the part where the electrode 80 is provided so that the electric potential of the semiconductor substrate 30 can be taken out easily. Here, the electrode 80 can be made of an aluminum alloy (such as AlSi).

Moreover, a cavity 31 is formed on a lower side (the side to be bonded to the glass substrate 20: the other side) of the semiconductor substrate 30. A thin-plate portion 34 is formed as a consequence of formation of the cavity 31, and a function as a diaphragm 50 to bend in accordance with a physical quantity applied from the outside is imparted to the thin-plate portion 34. As described above, in this embodiment, the diaphragm 50 which bends in accordance with a physical quantity applied from the outside is formed integrally with the semiconductor substrate 30.

The cavity 31 can be formed by subjecting the semiconductor substrate 30 to a vertical etching process by use of a publicly known semiconductor process such as reactive ion etching (RIE). Inductively coupled plasma (ICP) processing by using an etching system provided with the ICP, for example, can be used for the reactive ion etching.

In this embodiment, the cavity 31 in a substantially columnar shape is formed at a central part of the rectangular semiconductor substrate 30, and a second cavity 32 is also formed at a part where a through-hole 33 to be described later is formed. The second cavity 32 is formed to communicate with the cavity 31.

Moreover, the above-described electrode 60 is not only deposited at the part corresponding to the cavity 31 but also deposited at the part corresponding to the second cavity 32. In other words, the electrode 60 includes: an electrode body 62 which is formed at the part corresponding to the cavity 31 and opposed to the diaphragm 50 when the glass substrate 20 is bonded to the semiconductor substrate 30; and an extension portion 61 which extends into the second cavity. In this embodiment, the electrode body 62 and the extension portion 61 are made of the same material.

Meanwhile, a silicon oxide film (an insulating film: an insulator) 40 is formed on an inner surface (a surface on the first base material side of the diaphragm) 50a of the diaphragm 50. In this embodiment, the silicon oxide film 40 is formed by subjecting an inner side of the part of the semiconductor substrate 30 where the diaphragm 50 is formed (the thin-plate portion 34) to thermal oxidation. As described above, by forming the silicon oxide film 40 by the thermal oxidation, a thickness of the silicon oxide film 40 can be adjusted more easily, and the thickness can be made more uniform. In other words, the thickness of the silicon oxide film 40 can be set to a desired thickness more easily.

Accordingly, in this embodiment, the thin-plate portion 34 rendered flexure-deformable is formed by providing the semiconductor substrate 30 with the cavity 31. Moreover, the silicon oxide film 40 is formed on the inside of the thin-plate portion 34. As a consequence, the diaphragm 50 and the silicon oxide film 40 are formed integrally with the semiconductor substrate 30.

Moreover, the lower surface 30a side (the other side) of the semiconductor substrate 30 is fixedly bonded (fixed) to the upper surface 20a side (the one side) of the glass substrate 20 by anodic bonding or the like. As a consequence, the diaphragm 50 is formed, being supported by the semiconductor substrate 30 in such a way as to be opposed to the electrode 60 with a space S in between.

In the meantime, the through-hole 33 in a substantially columnar shape is formed at a part of the semiconductor substrate 30 corresponding to the extension portion 61 by means of ICP processing, alkaline etching, or the like. Thus, the extension portion 61 is exposed to the outside via the through-hole 33. Moreover, an electrode pad 70 in a substantially columnar shape made of an aluminum alloy (a material containing aluminum) such as AlSiCu and AlSi is formed on an upper surface 61a of the extension portion 61 which is exposed to the outside. The electric potential of the electrode 60 can be taken outside by connecting a not-illustrated bonding wire to the electrode pad 70. Meanwhile, in this embodiment, the silicon oxide film 40 is also formed at the part where the through-hole 33 is provided as shown in FIGS. 1 and 2. Accordingly, the through-hole 33 is formed to penetrate the semiconductor substrate 30 and the silicon oxide film 40.

It is to be noted that, in this embodiment, a wall portion 41 is formed between the silicon oxide film (the insulating film: the insulator) 40 and the electrode 60, so that the wall portion 41 defines the space S separately from an external space.

To be more precise, the wall portion 41 is provided which is closed in a substantially columnar shape in planar view to surround the through-hole 33, and a tip end of the wall portion 41 is brought into contact with the surface 60a of the electrode 60 (which is the extension portion 61 in this embodiment). Thus, the space S and the external space (the through-hole 33) are defined.

In this embodiment, the silicon oxide film (the insulating film: the insulator) 40 is provided with a projection 40a that projects toward the electrode 60 (the extension portion 61) side, and the projection 40a is used as the wall portion 41.

Specifically, in this embodiment, the wall portion 41 is designed to include the projection 40a that projects from the silicon oxide film (the insulating film: the insulator) 40, which corresponds to at least one of the silicon oxide film (the insulating film: the insulator) 40 and the electrode 60, toward the electrode 60, which corresponds to the other one.

In addition, in this embodiment, the projection 40a is formed to have a projection length which is slightly longer than a distance d1 between opposed surfaces of the silicon oxide film (the insulating film: the insulator) 40 and the electrode 60. Moreover, in bonding the glass substrate 20 and the semiconductor substrate 30 together, at least one of a tip end of the projection 40a and a contact portion of the electrode 60 is crushed and deformed, and thereby adhesion between the projection 40a and the electrode 60 is increased. In this way, the degree of sealing of the space S can be enhanced.

The projection 40a can be formed, for example, by preventing a portion corresponding to the silicon oxide film (the insulating film: the insulator) 40 and the projection 40a from removal by etching at the time of forming the cavity 31 and the second cavity 32 in the semiconductor substrate 30, and then subjecting the portion having survived the etching to a thermal oxidation process.

The semiconductor physical quantity sensor 10 having the above-described configuration can be formed in accordance with the following method, for example.

First, the electrode 60 inclusive of the extension portion 61 is deposited at the part of the upper surface 20a of the glass substrate 20 corresponding to the cavity 31 and the second cavity 32, and the electrode pad 70 is formed on the extension portion 61 (a first step).

Then, the cavity 31 and the second cavity 32 are formed by etching the other surface side of the semiconductor substrate 30. Thereafter, the portion corresponding to the silicon oxide film (the insulating film: the insulator) 40 and the projection 40a is subjected to the thermal oxidation process, and the silicon oxide film (the insulating film: the insulator) 40 and the projection 40a are thus formed (a second step).

Here, regarding the order of the first step and the second step, the second step may be carried out in advance or the first step and the second step may be carried out simultaneously in parallel.

Next, the lower surface 30a side (the other side) of the semiconductor substrate 30 is fixedly bonded (fixed) to the upper surface 20a side (the one side) of the glass substrate 20 by anodic bonding or the like (a third step). In this process, the glass substrate 20 is directly bonded to the semiconductor substrate 30. In this state, the projection 40a and the electrode 60 (the extension portion 61) come into contact with each other by the crush-deformation of at least one of these constituents.

Thereafter, the thickness of the thin-plate portion 34 (the diaphragm 50) is adjusted to a predetermined thickness by removing an upper part of the semiconductor substrate 30 (a fourth step). Note that the fourth step may be carried out before the third step. Alternatively, by using the semiconductor substrate 30 formed with the predetermined thickness in advance, the thin-plate portion 34 (the diaphragm 50) may be formed with the predetermined thickness in forming the cavity 31 and the second cavity 32. In other words, the fourth step may be omitted.

Then, the electrode 80 is formed on the upper surface 30b of the semiconductor substrate 30 (a fifth step).

Thereafter, the through-hole 33 is formed such that the portion, which is surrounded by the projection 40a with its tip end in contact with the extension portion 61, communicates with the external space (a sixth step). Here, it is also possible to carry out the sixth step before the fifth step.

In this way, the space S is hermetically sealed. At the same time, the semiconductor physical quantity sensor 10 is formed such that the electrode 60 and the diaphragm 50 are disposed opposite to each other while interposing the space S and the silicon oxide film (the insulating film: the insulator) 40 in between.

Here, this embodiment shows the example in which the projection 40a (the wall portion 41) hermetically seals the space S. However, it is also possible to adopt a configuration in which the space S communicates with the external space via a very small gap (a gap small enough to inhibit grit, dust, and the like from getting into the space S).

In other words, it is also possible to adopt a configuration in which the projection 40a does not come into contact with the electrode 60 (the extension portion 61) in the state where the glass substrate 20 is bonded to the semiconductor substrate 30.

Figure 3:
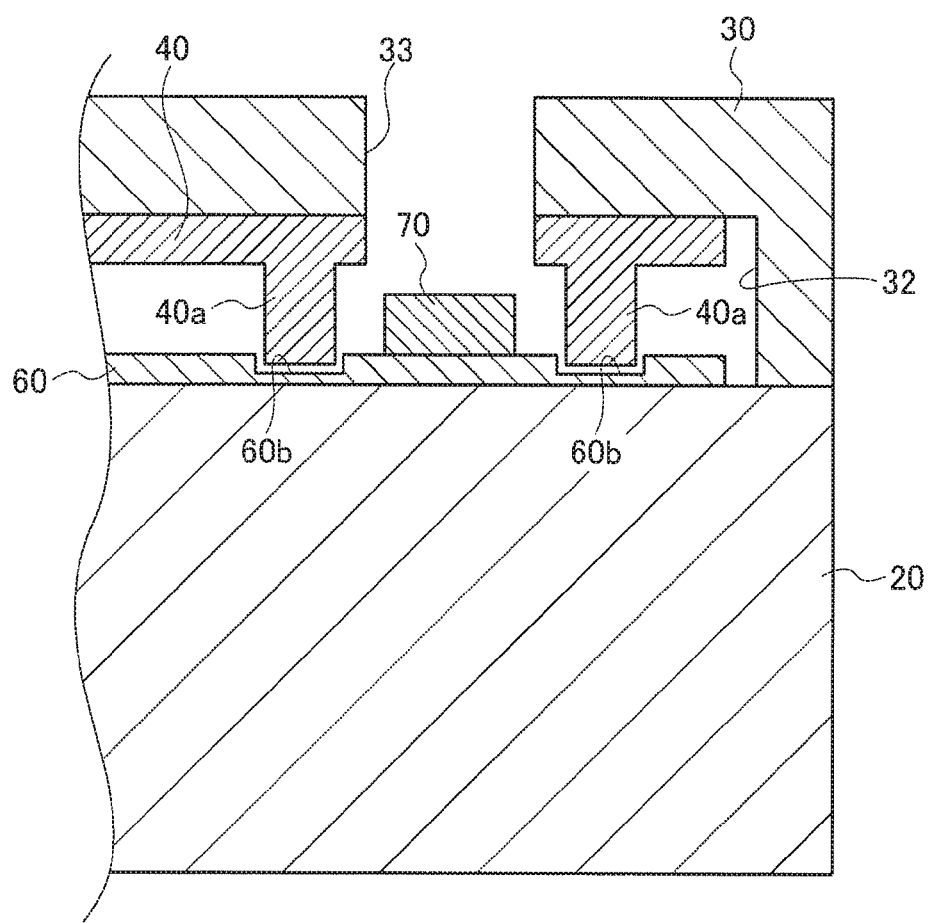
FIG. 3 is a partially enlarged cross-sectional view schematically showing a semiconductor physical quantity sensor according to a first modified example of the first embodiment of the present invention.

When the projection 40a is not brought into contact with the electrode 60 (the extension portion 61) as described above, it is preferable to set the projection length of the projection 40a longer than the distance between the opposed surfaces of the silicon oxide film (the insulating film: the insulator) 40 and the electrode 60, and to form a groove 60b at a part of the electrode 60 corresponding to the projection 40a as shown in FIG. 3, so that the tip end of the projection 40a is housed inside the groove 60b when the glass substrate 20 is bonded to the semiconductor substrate 30. In this way, it is possible to bend the gap connecting the space S to the external space, and thus to more reliably inhibit grit, dust, and the like from getting into the space S.

Figure 4:
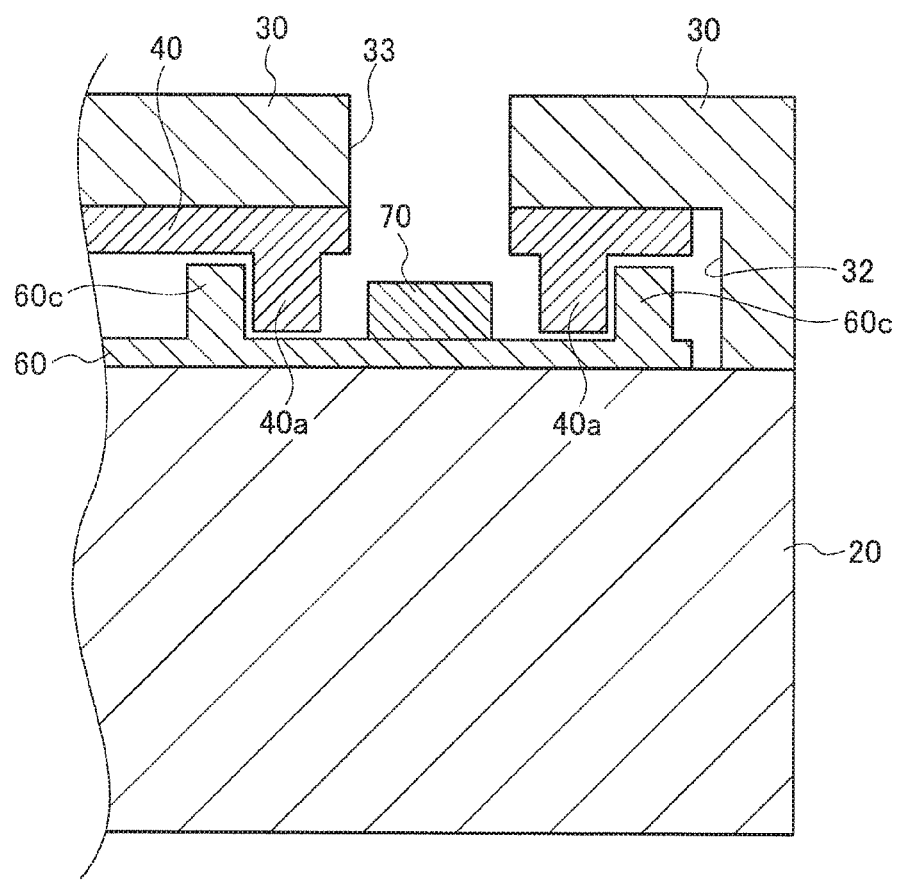
FIG. 4 is a partially enlarged cross-sectional view schematically showing a semiconductor physical quantity sensor according to a second modified example of the first embodiment of the present invention.

Meanwhile, as shown in FIG. 4, the silicon oxide film (the insulating film: the insulator) 40 and the electrode 60 may be provided with projections 40a and 60c, respectively, and the projections 40a and 60c may be formed to overlap each other in a thickness direction (a vertical direction) in a state viewed from a radial direction of the space S. Here, the projection 60c may be formed on the inside (the electrode pad 70 side) of the projection 40a. In this way, the gap connecting the space S and the external space is formed into a crank shape, and it is thus possible to more reliably inhibit grit, dust, and the like from getting into the space S.

Here, various structures are also applicable to the configuration in which the projection 40a comes into contact with the electrode 60 (the extension portion 61) in the state where the glass substrate 20 is bonded to the semiconductor substrate 30. For example, it is also possible to interpose an easily crush-deformable member between the projection 40a and the electrode 60 (the extension portion 61). Meanwhile, the shape of the tip end of the projection can take various shapes.

As described above, in the case where the wall portion 41 includes the projection regardless of whether the space S is hermetically sealed or not hermetically sealed, the projection that projects from at least one of the silicon oxide film (the insulating film: the insulator) 40 and the electrode 60 toward the other one of them only needs to be formed. Here, the minimum required number of such projections is one, or to put it another way, the space S may also be defined by using multiple projections.

By use of the semiconductor physical quantity sensor 10 having the above-described configuration, when a certain physical quantity is applied from the outside, the diaphragm 50 bends according to the applied physical quantity whereby the distance between the electrode 60 and the diaphragm 50 (a distance d2 between the inner surface 50a of the diaphragm 50 and the surface 60a of the electrode 60) changes accordingly. Hence, capacitance of the semiconductor physical quantity sensor 10 (capacitance between the diaphragm 50 and the electrode 60) also changes in accordance with the change in distance between the electrode 60 and the diaphragm 50. Moreover, the change in capacitance between the diaphragm 50 and the electrode 60 is taken out of the electrode pad 70 and the electrode 80, and a change in physical quantity can be detected by use of the change in capacitance.

Furthermore, even when a relatively large physical quantity is applied and the diaphragm 50 comes into contact with the electrode 60 via the silicon oxide film 40, this embodiment is designed to be able to detect such a physical quantity. In other words, the applied physical quantity can be detected by using a relation between a change in contact area of the diaphragm 50 with the electrode 60 and the change in capacitance. As described above, this embodiment shows the example of the semiconductor physical quantity sensor 10 which can detect the applied physical quantity even when the diaphragm 50 comes into contact with the electrode 60 via the silicon oxide film 40. However, the semiconductor physical quantity sensor can also be made usable only in a situation where the diaphragm does not come into contact with the electrode.

As described above, in this embodiment, the semiconductor physical quantity sensor 10 includes the glass substrate (the first base material) 20, the electrode 60 formed on the glass substrate (the first base material) 20, and the diaphragm 50 which bends in accordance with a physical quantity applied from the outside. The semiconductor physical quantity sensor 10 further includes: the semiconductor substrate (the second base material) 30 which is fixed to the glass substrate (the first base material) 20, and supports the diaphragm 50 such that the diaphragm 50 is opposed to the electrode 60 with the space S in between; and the silicon oxide film (the insulator) 40 formed on the inner surface (the surface on the first base material side) 50a of the diaphragm 50.

In other words, the semiconductor physical quantity sensor 10 of this embodiment includes the electrode 60 formed on the glass substrate (the first base material) 20, and the silicon oxide film (the insulator) 40 formed on the diaphragm 50 side to be supported by the semiconductor substrate (the second base material) 30.

The configuration, therefore, inhibits the insulator from forming irregularities on an edge portion of the electrode 60, which would be formed due to the thermal process as in the case where the insulator is provided over the electrode 60. Thus, each of the electrode 60 and the silicon oxide film (the insulator) 40 can be formed into a flat surface more reliably. As a consequence, it is possible to more reliably set the distance between the electrode 60 and the diaphragm 50 to a constant distance, and to enhance detection accuracy of the semiconductor physical quantity sensor 10.

Meanwhile, in this embodiment, the wall portion 41 to define the space S is formed between the silicon oxide film (the insulator) 40 and the electrode 60 (the extension portion 61). By defining the space S with the wall portion 41 formed between the silicon oxide film (the insulator) 40 and the electrode 60 (the extension portion 61) as described above, it is possible to inhibit grit, dust, and the like from getting into the space S.

Furthermore, in this embodiment, the wall portion 41 includes the projection 40a which projects from the silicon oxide film (the insulating film: the insulator) 40, which corresponds to at least one of the silicon oxide film (the insulating film: the insulator) 40 and the electrode 60, toward the electrode 60, which corresponds to the other one.

In this way, the space S can be defined by using a simpler configuration, whereby the semiconductor physical quantity sensor 10 can be manufactured more easily. Particularly, in this embodiment, the cavity 31 and the second cavity 32 are formed by etching the other surface side of the semiconductor substrate 30 while preventing the portion corresponding to the silicon oxide film (the insulating film: the insulator) 40 and the projection 40a from removal. Then, the portion corresponding to the silicon oxide film (the insulating film: the insulator) 40 and the projection 40a is subjected to the thermal oxidation process to form the silicon oxide film (the insulating film: the insulator) 40 and the projection 40a. Accordingly, the wall portion 41 (the projection 40a) that defines the space S can be formed more easily, and an amount of projection of the wall portion 41 (the projection 40a) can readily be adjusted. As a consequence, it is possible to avoid unevenness in the amount of projection of the wall portion 41 (the projection 40a), and to accurately establish a parallel state of the opposed surfaces of the diaphragm 50 and the electrode 60 when the glass substrate 20 is bonded to the semiconductor substrate 30. Thus, the detection accuracy of the semiconductor physical quantity sensor 10 can be further enhanced.

Meanwhile, a layer thickness of the insulating layer can more reliably be set to a constant thickness by subjecting the semiconductor substrate 30 to the thermal oxidation process, thereby forming the insulator (the silicon oxide film 40). Thus, the detection accuracy of the semiconductor physical quantity sensor 10 can be further improved.

In the meantime, the electrode 60 is formed from the metal material such as chromium, a titanium-aluminum alloy, and an aluminum alloy (such as AlSi and AlSiCu) (at least one material out of chromium, aluminum, a titanium-aluminum alloy, and an aluminum alloy). Thus, it is possible to form the electrode 60 easily by means of deposition, to more reliably set a layer thickness of the electrode 60 to a constant thickness, and to further improve the detection accuracy of the semiconductor physical quantity sensor 10.

Meanwhile, the electrode 60 includes the extension portion 61 extending to the outside of the space S, and the extension portion 61 is provided with the electrode pad 70 made of the aluminum alloy (the material containing aluminum) such as AlSiCu and AlSi. Thus, it is possible to connect the non-illustrated bonding wire easily and reliably.

In the meantime, in this embodiment, the wall portion 41 is provided which is closed in a substantially circular shape in planar view to surround the substantially columnar through-hole 33, and the tip end of the wall portion 41 is brought into contact with the surface 60a of the electrode 60 (which is the extension portion 61 in this embodiment). Thus, the space S and the external space (the through-hole 33) are defined. In this way, it is possible to define the space S and the external space and to hermetically seal the space S without strictly setting a positional relation between the space S and the wall portion 41. In other words, even when the wall portion 41 causes a displacement when the glass substrate 20 is bonded to the semiconductor substrate 30, the space S and the external space can be defined by the wall portion 41 and the space S can be hermetically sealed.

Meanwhile, in this embodiment, the through-hole 33 is formed to penetrate the semiconductor substrate 30 in the thickness direction, so that the electric potential of the electrode 60 can be taken outside from the through-hole 33. As a consequence, it is no longer necessary to interpose the electrode 60 at a bonding part of the glass substrate 20 and the semiconductor substrate 30 in order to take out the electric potential of the electrode 60. Hence, the glass substrate 20 can be directly bonded to the semiconductor substrate 30. In this way, it is possible to suppress formation of a gap at the bonding part of the glass substrate 20 and the semiconductor substrate 30, and to more reliably bond the glass substrate 20 to the semiconductor substrate 30.

Second Embodiment

Figure 5:
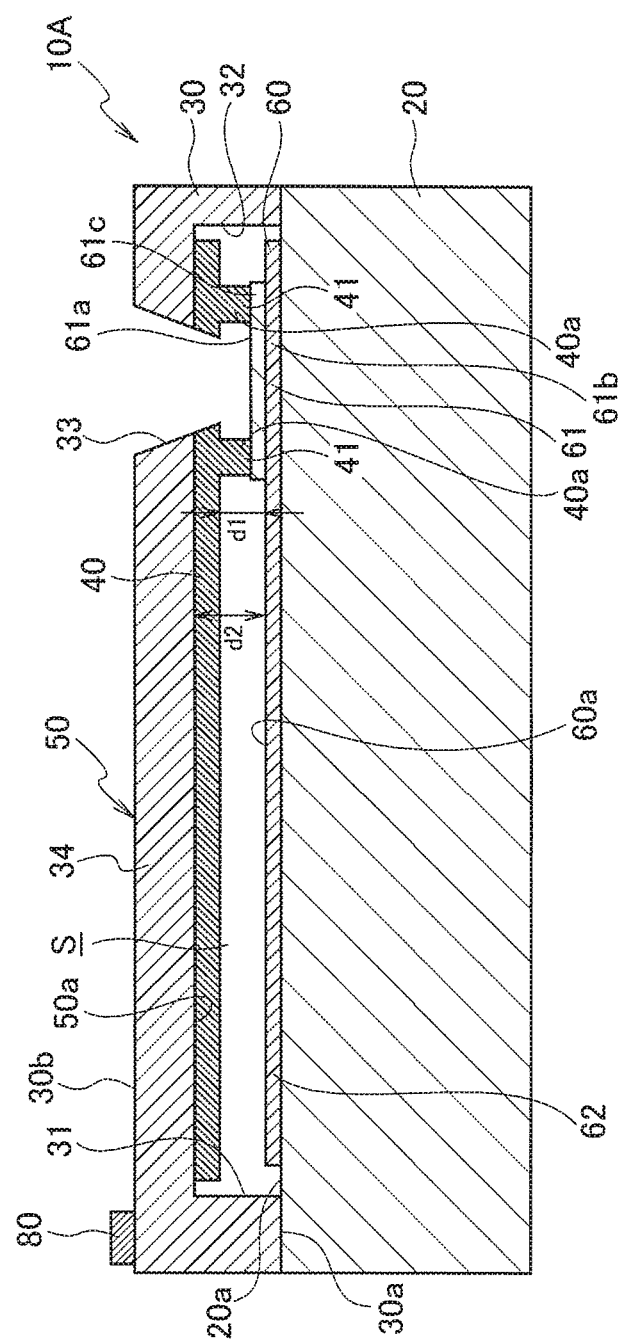
FIG. 5 is a cross-sectional view schematically showing a semiconductor physical quantity sensor according to a second embodiment of the present invention, which is a view corresponding to FIG. 2.

A semiconductor physical quantity sensor 10A of this embodiment basically has a configuration which is substantially the same as the semiconductor physical quantity sensor 10 shown in the above-described first embodiment. Specifically, as shown in FIG. 5, the semiconductor physical quantity sensor 10A includes the glass substrate (the first base material) 20 in a substantially rectangular plate shape. Moreover, the electrode 60 is formed on the upper surface (the surface to which the second base material is fixed) 20a of the glass substrate 20.

In addition, the semiconductor physical quantity sensor 10A includes the semiconductor substrate (the second base material) 30 to be fixedly bonded (fixed) to the glass substrate 20. The lower surface 30a side (the other side) of the semiconductor substrate 30 is fixedly bonded (fixed) to the upper surface 20a side (the one side) of the glass substrate 20.

Moreover, the electrode 80 to take the electric potential out of the semiconductor substrate 30 is provided at an arbitrary part on the upper surface 30b of the semiconductor substrate 30.

In addition, the cavity 31 is formed on the lower side (the side to be bonded to the glass substrate 20: the other side) of the semiconductor substrate 30. The thin-plate portion 34 is formed as a consequence of formation of the cavity 31, and the function as the diaphragm 50 to bend in accordance with the physical quantity applied from the outside is imparted to the thin-plate portion 34.

In this embodiment as well, the cavity 31 in the substantially columnar shape is formed at the central part of the rectangular semiconductor substrate 30, and the second cavity 32 is also formed at the part where the through-hole 33 is provided. The second cavity 32 is formed to communicate with the cavity 31. Here, FIG. 5 shows the through-hole 33 having a substantially truncated square pyramid shape as the example of the through-hole 33. However, it is also possible to form the through-hole 33 into the substantially cylindrical shape as in the above-described first embodiment. On the other hand, the shape of the through-hole 33 in the above-described first embodiment may also be designed as the substantially truncated square pyramid shape. As described above, the shape of the through-hole 33 can take various shapes.

Moreover, the above-described electrode 60 is not only deposited at the part corresponding to the cavity 31 but also deposited at the part corresponding to the second cavity 32. In other words, the electrode 60 includes: the electrode body 62 which is formed at the part corresponding to the cavity 31 and opposed to the diaphragm 50 when the glass substrate 20 is bonded to the semiconductor substrate 30; and the extension portion 61 which extends into the second cavity.

Meanwhile, the silicon oxide film (the insulating film: the insulator) 40 is formed on the inner surface (the surface on the first base material side of the diaphragm) 50a of the diaphragm 50. In this embodiment as well, the silicon oxide film 40 is formed by subjecting the inner side of the part of the semiconductor substrate 30 where the diaphragm 50 is formed (the thin-plate portion 34) to the thermal oxidation.

Moreover, the wall portion 41 is formed between the silicon oxide film (the insulating film: the insulator) 40 and the electrode 60, so that the wall portion 41 defines the space S separately from the external space.

Here, at least a part of the extension portion 61 corresponding to the through-hole 33 is formed from two layers (multiple layers) in this embodiment.

Specifically, the part of the extension portion 61 corresponding to the through-hole 33 includes two layers of: a lower layer portion 61b, which is made of the same material as that of the electrode body 62 and extends integrally from the electrode body 62; and an upper layer portion 61c which is stacked on an upper side of the lower layer portion 61b.

The upper layer portion 61c can be formed by depositing a film on the lower layer portion 61b while using any of metal materials including an aluminum alloy (such as AlSi and AlSiCu), aluminum (Al), gold (Au), and the like. Note that the upper layer portion 61c is made of a different material from that of the electrode body 62 in this embodiment. In other words, the extension portion 61 is formed from the two layers including the lower layer portion 61b and the upper layer portion 61c that is made of the different material from that of the lower layer portion 61b.

Moreover, the electric potential of the electrode 60 can be taken outside by directly connecting a not-illustrated bonding wire to the upper surface (an upper surface of the upper layer portion 61c) 61a of the extension portion 61 exposed to the outside via the through-hole 33. Accordingly, as the material of the upper layer portion 61c, a material other than the materials cited above is applicable as long as such a material enables direct connection to the bonding wire.

Meanwhile, in this embodiment, the wall portion 41 is provided which is closed in the rectangular shape in planar view to surround the through-hole 33, and the upper layer portion 61c is formed into either a region as large as the outer periphery of the wall portion 41 or a region slightly larger than the outer periphery of the wall portion 41 in planar view. Then, the tip end of the wall portion 41 is opposed to the upper surface of the upper layer portion 61c. Thus, the space S and the external space (the through-hole 33) are defined. Note that the space S is hermetically sealed in this embodiment by bringing the tip end of the wall portion 41 into contact with the upper surface of the upper layer portion 61c and thus crushing and deforming the upper layer portion 61c.

The above-described embodiment can also achieve the operation and effect similar to those of the above-described first embodiment.

In addition, in this embodiment, the upper layer portion 61c is made of the different material from that of the electrode body 62. For example, deformation of the electrode body 62 is suppressed when the electrode body 62 which comes into contact with the diaphragm 50 is made of chromium having relatively high hardness while the upper layer portion 61c which comes into contact with the tip end of the wall portion 41 is made of an aluminum alloy (such as AlSi and AlSiCu) having relatively low hardness. Accordingly, it is possible to suppress reduction in detection accuracy of the semiconductor physical quantity sensor 10A, and moreover, to enhance the adhesion between the tip end of the wall portion 41 and the upper layer portion 61c. Thus, the hermetic seal of the space S can be enhanced.

Figure 6:
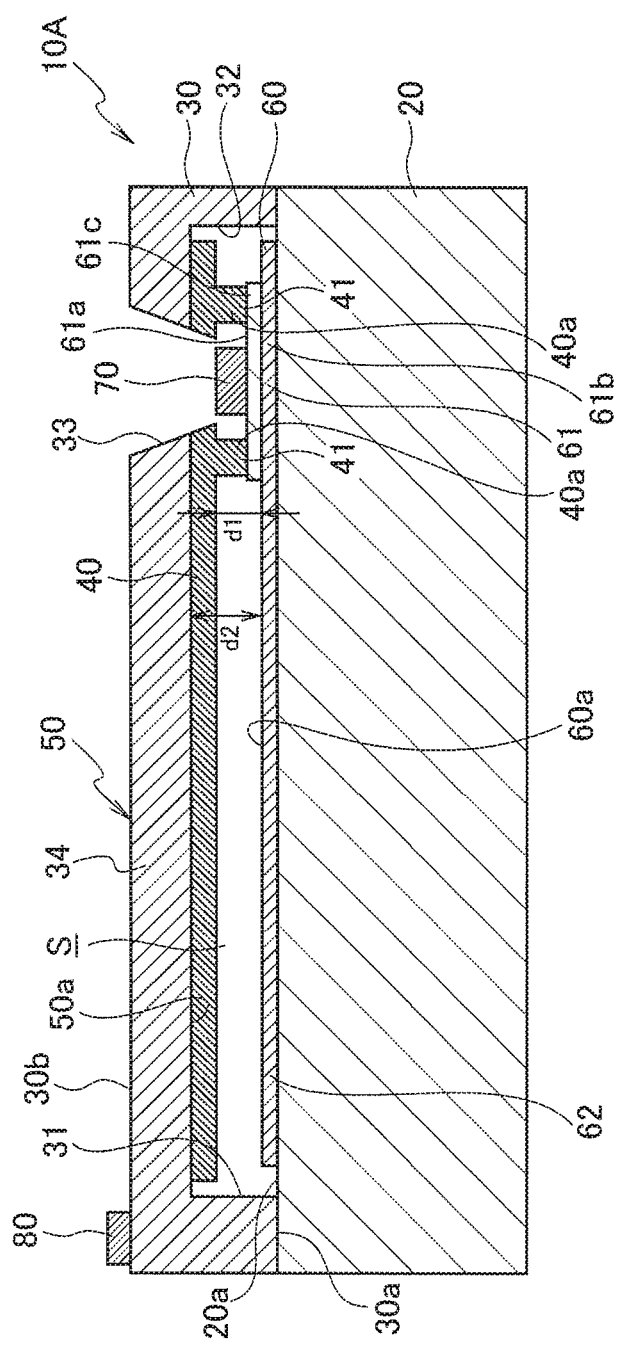
FIG. 6 is a cross-sectional view schematically showing a semiconductor physical quantity sensor according to a modified example of the second embodiment of the present invention, which is a view corresponding to FIG. 2.

Here, in this embodiment as well, the electrode pad 70 made of the aluminum alloy (the material containing aluminum) such as AlSiCu and AlSi may be formed as shown in FIG. 6, and the not-illustrated bonding wire may be connected to the electrode pad 70. In this way, it is possible to bring a position to connect the bonding wire closer to an opening side of the through-hole 33. Thus, there is an advantage that it is easier to carry out connecting work using the bonding wire. Note that the shape of the electrode pad 70 may be formed into a rectangular shape in planar view or may be formed into a circular shape in planar view. On the other hand, in the above-described first embodiment, the shape of the electrode pad 70 may be formed into a circular shape in planar view. As described above, the shape of the electrode pad 70 can also take various shapes.

Third Embodiment

Figure 7:
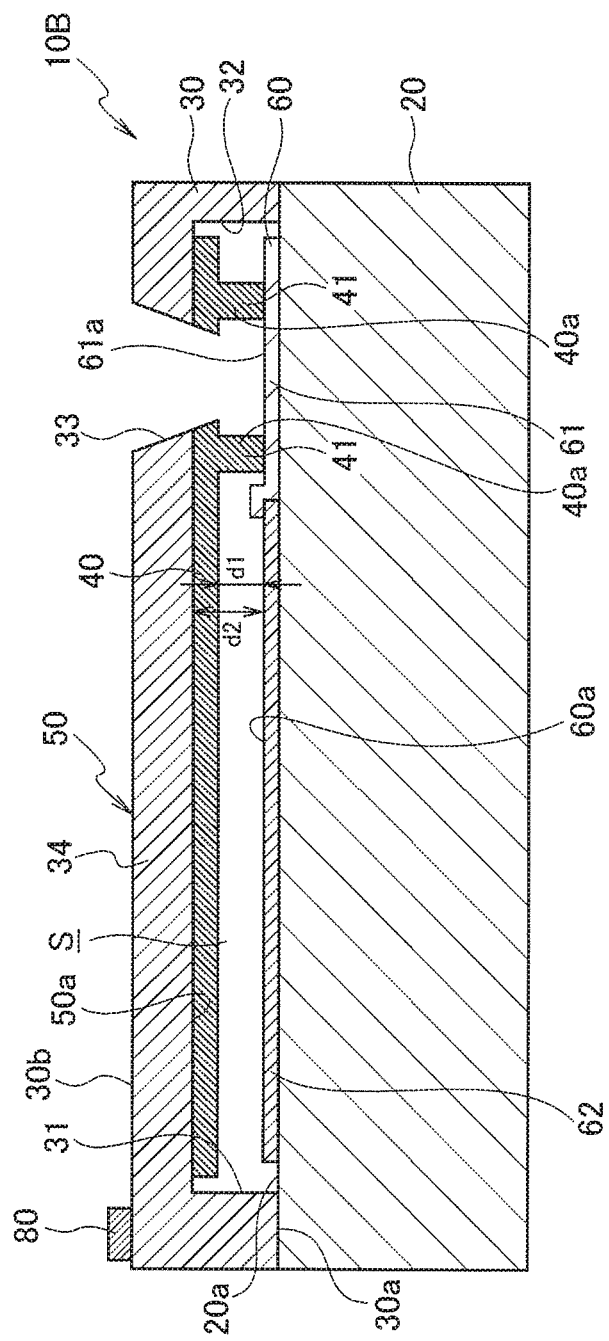
FIG. 7 is a cross-sectional view schematically showing a semiconductor physical quantity sensor according to a third embodiment of the present invention, which is a view corresponding to FIG. 2.

A semiconductor physical quantity sensor 10B of this embodiment basically has a configuration which is substantially the same as the semiconductor physical quantity sensor 10 shown in the above-described first embodiment. Specifically, as shown in FIG. 7, the semiconductor physical quantity sensor 10B includes the glass substrate (the first base material) 20 in a substantially rectangular plate shape. Moreover, the electrode 60 is formed on the upper surface (the surface to which the second base material is fixed) 20a of the glass substrate 20.

In addition, the semiconductor physical quantity sensor 10B includes the semiconductor substrate (the second base material) 30 to be fixedly bonded (fixed) to the glass substrate 20. The lower surface 30a side (the other side) of the semiconductor substrate 30 is fixedly bonded (fixed) to the upper surface 20a side (the one side) of the glass substrate 20.

Moreover, the electrode 80 to take the electric potential out of the semiconductor substrate 30 is provided at an arbitrary part on the upper surface 30b of the semiconductor substrate 30.

In addition, the cavity 31 is formed on the lower side (the side to be bonded to the glass substrate 20: the other side) of the semiconductor substrate 30. The thin-plate portion 34 is formed as a consequence of formation of the cavity 31, and the function as the diaphragm 50 to bend in accordance with the physical quantity applied from the outside is imparted to the thin-plate portion 34.

In this embodiment as well, the cavity 31 in the substantially columnar shape is formed at the central part of the rectangular semiconductor substrate 30, and the second cavity 32 is also formed at the part where the through-hole 33 is provided. The second cavity 32 is formed to communicate with the cavity 31.

Moreover, the above-described electrode 60 is not only deposited at the part corresponding to the cavity 31 but also deposited at the part corresponding to the second cavity 32. In other words, the electrode 60 includes: the electrode body 62 which is formed at the part corresponding to the cavity 31 and opposed to the diaphragm 50 when the glass substrate 20 is bonded to the semiconductor substrate 30; and the extension portion 61 which extends into the second cavity.

Meanwhile, the silicon oxide film (the insulating film: the insulator) 40 is formed on the inner surface (the surface on the first base material side of the diaphragm) 50a of the diaphragm 50. In this embodiment as well, the silicon oxide film 40 is formed by subjecting the inner side of the part of the semiconductor substrate 30 where the diaphragm 50 is formed (the thin-plate portion 34) to the thermal oxidation.

Moreover, the wall portion 41 is formed between the silicon oxide film (the insulating film: the insulator) 40 and the electrode 60, so that the wall portion 41 defines the space S separately from the external space.

Here, the extension portion 61 is made of a different material from that of the electrode body 62 in this embodiment.

For example, chromium can be used as the material of the electrode body 62. Meanwhile, an aluminum alloy (such as AlSi and AlSiCu) can be used as the material of the extension portion 61, for example. Here, the material to form the electrode body 62 and the material to form the extension portion 61 can be set as appropriate.

When forming the extension portion 61, it is preferable to form such that the end portion of the extension portion 61 overlaps an end portion of the electrode body 62 (to form a contact portion of the extension portion 61 and the electrode body 62 from two layers) as shown in FIG. 7. In this way, it is possible to suppress poor connection between the electrode body 62 and the extension portion 61, and thus to electrically connect the electrode body 62 to the extension portion 61 in a more reliable fashion.

Moreover, the electric potential of the electrode 60 can be taken outside by directly connecting a not-illustrated bonding wire to the upper surface 61a of the extension portion 61 exposed to the outside via the through-hole 33. Accordingly, as the material of the extension portion 61, a material other than the materials cited above is applicable as long as such a material enables direct connection to the bonding wire.

Meanwhile, in this embodiment, the wall portion 41 is provided which is closed in the rectangular shape in planar view to surround the through-hole 33. Then, the tip end of the wall portion 41 is opposed to the upper surface 61a of the extension portion 61. Thus, the space S and the external space (the through-hole 33) are defined. Note that the space S is hermetically sealed in this embodiment by bringing the tip end of the wall portion 41 into contact with the upper surface 61a of the extension portion 61 and thus crushing and deforming the extension portion 61.

The above-described embodiment can also achieve the operation and effect similar to those of the above-described first embodiment.

In addition, in this embodiment, the extension portion 61 is made of the different material from that of the electrode body 62. For example, deformation of the electrode body 62 is suppressed when the electrode body 62 which comes into contact with the diaphragm 50 is made of chromium having relatively high hardness while the extension portion 61 which comes into contact with the tip end of the wall portion 41 is made of an aluminum alloy (such as AlSi and AlSiCu) having relatively low hardness. Accordingly, it is possible to suppress reduction in detection accuracy of the semiconductor physical quantity sensor 10B, and moreover, to enhance the adhesion between the tip end of the wall portion 41 and the extension portion 61. Thus, the hermetic seal of the space S can be enhanced.

Figure 8:
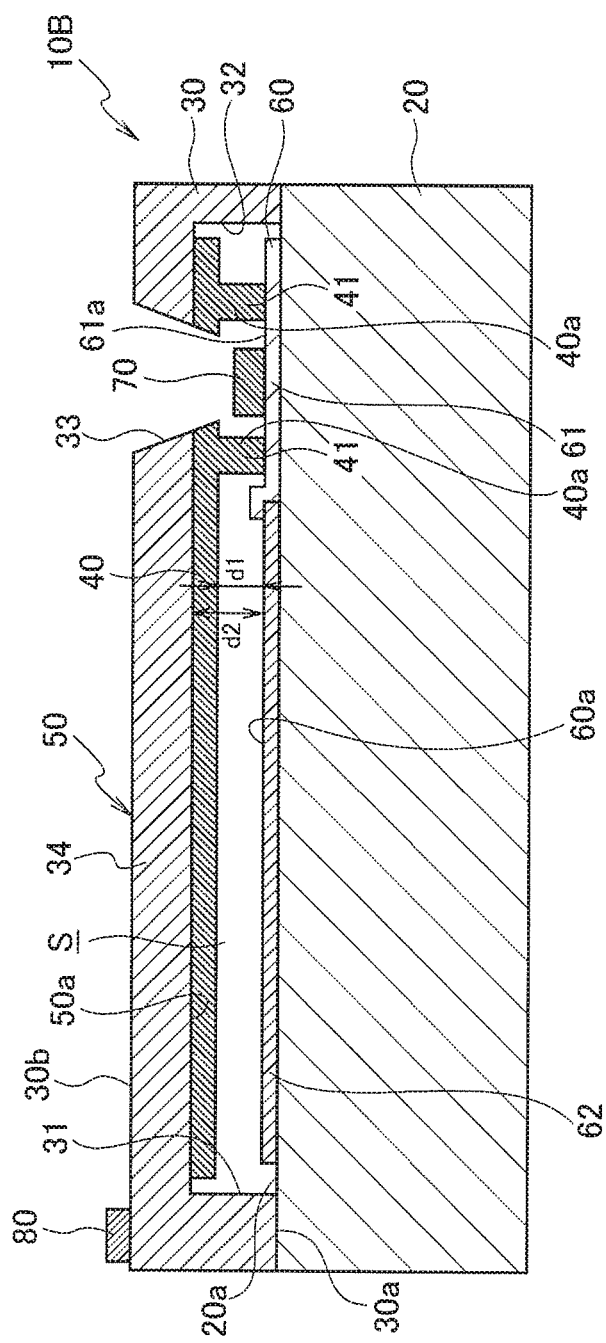
FIG. 8 is a cross-sectional view schematically showing a semiconductor physical quantity sensor according to a modified example of the third embodiment of the present invention, which is a view corresponding to FIG. 2.

Here, in this embodiment as well, the electrode pad 70 made of the aluminum alloy (the material containing aluminum) such as AlSiCu and AlSi may be formed as shown in FIG. 8, and the not-illustrated bonding wire may be connected to the electrode pad 70. In this way, it is possible to bring a position to connect the bonding wire closer to the opening side of the through-hole 33. Thus, there is an advantage that it is easier to carry out the connecting work using the bonding wire.

Fourth Embodiment

Figure 9:
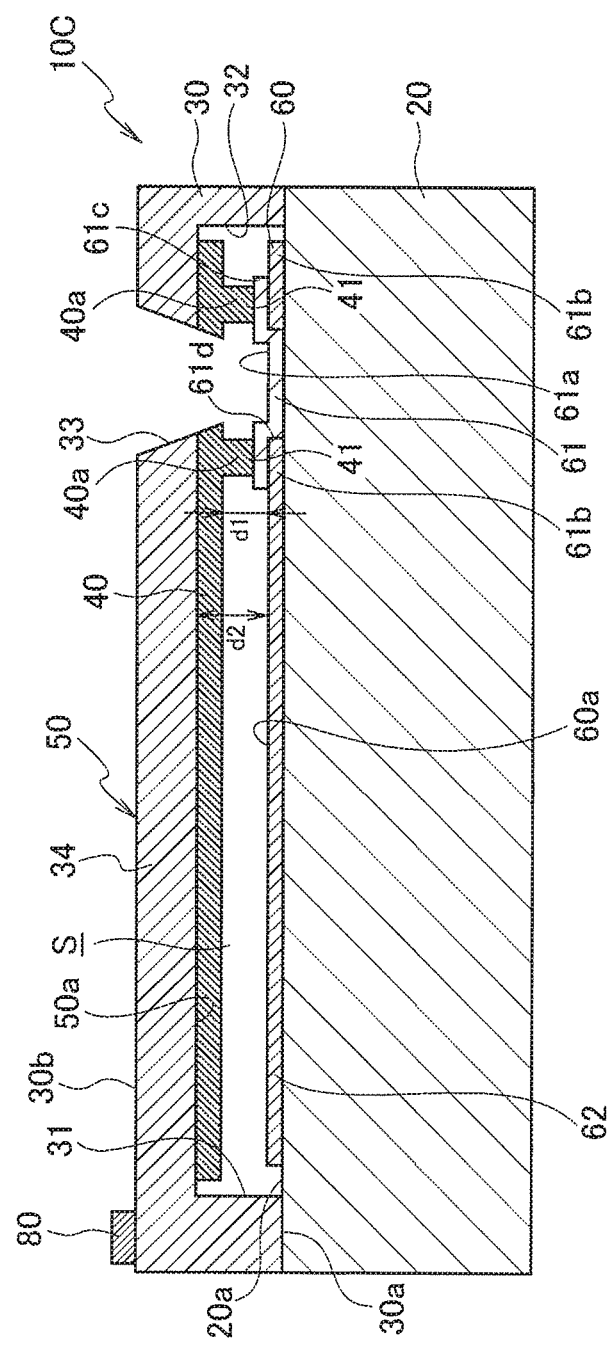
FIG. 9 is a cross-sectional view schematically showing a semiconductor physical quantity sensor according to a fourth embodiment of the present invention, which is a view corresponding to FIG. 2.

A semiconductor physical quantity sensor 10C of this embodiment basically has a configuration which is substantially the same as the semiconductor physical quantity sensor 10 shown in the above-described first embodiment. Specifically, as shown in FIG. 9, the semiconductor physical quantity sensor 10C includes the glass substrate (the first base material) 20 in a substantially rectangular plate shape. Moreover, the electrode 60 is formed on the upper surface (the surface to which the second base material is fixed) 20a of the glass substrate 20.

In addition, the semiconductor physical quantity sensor 10C includes the semiconductor substrate (the second base material) 30 to be fixedly bonded (fixed) to the glass substrate 20. The lower surface 30a side (the other side) of the semiconductor substrate 30 is fixedly bonded (fixed) to the upper surface 20a side (the one side) of the glass substrate 20.

Moreover, the electrode 80 to take the electric potential out of the semiconductor substrate 30 is provided at an arbitrary part on the upper surface 30b of the semiconductor substrate 30.

In addition, the cavity 31 is formed on the lower side (the side to be bonded to the glass substrate 20: the other side) of the semiconductor substrate 30. The thin-plate portion 34 is formed as a consequence of formation of the cavity 31, and the function as the diaphragm 50 to bend in accordance with the physical quantity applied from the outside is imparted to the thin-plate portion 34.

In this embodiment as well, the cavity 31 in the substantially columnar shape is formed at the central part of the rectangular semiconductor substrate 30, and the second cavity 32 is also formed at the part where the through-hole 33 is provided. The second cavity 32 is formed to communicate with the cavity 31.

Moreover, the above-described electrode 60 is not only deposited at the part corresponding to the cavity 31 but also deposited at the part corresponding to the second cavity 32. In other words, the electrode 60 includes: the electrode body 62 which is formed at the part corresponding to the cavity 31 and opposed to the diaphragm 50 when the glass substrate 20 is bonded to the semiconductor substrate 30; and the extension portion 61 which extends into the second cavity.

Meanwhile, the silicon oxide film (the insulating film: the insulator) 40 is formed on the inner surface (the surface on the first base material side of the diaphragm) 50a of the diaphragm 50. In this embodiment as well, the silicon oxide film 40 is formed by subjecting the inner side of the part of the semiconductor substrate 30 where the diaphragm 50 is formed (the thin-plate portion 34) to the thermal oxidation.

Moreover, the wall portion 41 is formed between the silicon oxide film (the insulating film: the insulator) 40 and the electrode 60, so that the wall portion 41 defines the space S separately from the external space.

Here, at least the part of the extension portion 61 corresponding to the through-hole 33 is made of a different material from that of the electrode body 62, and a part of the extension portion 61 opposed to the wall portion 41 is formed from two layers (multiple layers) in this embodiment.

Specifically, a pocket portion 61d is formed at a part of the lower layer portion 61b corresponding to the through-hole 33, the lower layer portion 61b being made of the same material as that of the electrode body 62 and extending integrally from the electrode body 62. Then, the extension portion 61 is formed by depositing a different material from that of the electrode body 62 such that the extension portion 61 covers the pocket portion 61d and the periphery thereof. In this way, at least the part of the extension portion 61 corresponding to the through-hole 33 is made of the different material from that of the electrode body 62, and the part of the extension portion 61 opposed to the wall portion 41 is formed from the two layers (the multiple layers) of the lower layer portion 61b and the upper layer portion 61c.

For example, chromium can be used as the material of the electrode body 62. Meanwhile, an aluminum alloy (such as AlSi and AlSiCu) can be used as the material to form the upper layer portion 61c, for example. Here, the material to form the electrode body 62 and the material to form the upper layer portion 61c can be set as appropriate.

Moreover, the electric potential of the electrode 60 can be taken outside by directly connecting a not-illustrated bonding wire to the upper surface 61a of the extension portion 61 exposed to the outside via the through-hole 33. Accordingly, as the material of the upper layer portion 61c, a material other than the materials cited above is applicable as long as such a material enables direct connection to the bonding wire.

Meanwhile, in this embodiment, the wall portion 41 is provided which is closed in the rectangular shape in planar view to surround the through-hole 33, and the tip end of the wall portion 41 is opposed to the upper surface of the upper layer portion 61c. Thus, the space S and the external space (the through-hole 33) are defined. Note that the space S is hermetically sealed in this embodiment by bringing the tip end of the wall portion 41 into contact with the upper surface 61a of the extension portion 61 and thus crushing and deforming the extension portion 61.

The above-described embodiment can also achieve the operation and effect similar to those of the above-described first embodiment.

In addition, in this embodiment, the extension portion 61 (the upper layer portion 61c) is made of the different material from that of the electrode body 62. For example, deformation of the electrode body 62 is suppressed when the electrode body 62 which comes into contact with the diaphragm 50 is made of chromium having relatively high hardness while the upper surface 61a side (the upper layer portion 61c) of the extension portion 61 which comes into contact with the tip end of the wall portion 41 is made of an aluminum alloy (such as AlSi and AlSiCu) having relatively low hardness. Accordingly, it is possible to suppress reduction in detection accuracy of the semiconductor physical quantity sensor 10C, and moreover, to enhance the adhesion between the tip end of the wall portion 41 and the upper layer portion 61c. Thus, the hermetic seal of the space S can be enhanced.

Here, although illustration is omitted therein, the electrode pad made of the aluminum alloy (the material containing aluminum) such as AlSiCu and AlSi may be formed in this embodiment as well.

Although the preferred embodiments of the present invention have been described above, the present invention is not limited only to the above-described embodiments, and various modifications are possible.

For example, each of the above-described embodiments and the modified examples thereof shows the example to form the space in the substantially columnar shape. Instead, the shape of the space may be formed into a substantially truncated conical shape. In this case, it is preferable to form the cavity by conducting anisotropic etching from a back surface side of the second base material.

Meanwhile, the through-hole 33 in the substantially columnar shape is shown as the example in the above-described first embodiment and the modified examples thereof. However, the shape of the through-hole 33 can also be formed into a substantially truncated pyramid shape. On the other hand, in each of the above-described second to fourth embodiments and the modified examples thereof, the shape of the through-hole 33 can also be formed into a substantially columnar shape. As described above, the through-hole 33 can take various shapes.

In the meantime, the electrode pad 70 having the substantially circular shape in planar view is shown as the example in the above-described first embodiment and the modified example thereof. However, the shape of the electrode pad 70 can also be formed into a substantially rectangular shape in planar view. On the other hand, in the modified example of the second embodiment and the modified example of the third embodiment described above, the shape of the electrode pad 70 can also be substantially circular in planar view. As described above, the electrode pad 70 can also take various shapes.

Meanwhile, the insulator made of the silicon oxide film is shown as the example in each of the above-described embodiments and the modified examples thereof. However, the insulator may be made of a silicon nitride film. In this way, by forming the insulator from the silicon nitride film having higher permittivity than that of the silicon oxide film, it is possible to enhance sensitivity of the semiconductor physical quantity sensor.

In the meantime, while the configuration in which the diaphragm is formed integrally with the second base material is shown as the example, it is also possible to form the diaphragm separately from the second base material.

Meanwhile, it is also possible to form the insulator separately from the diaphragm, and to form the wall portion as a member provided separately from the insulator or the electrode.

In the meantime, other detailed specifications (the shape, size, layout, and the like) of the first base member and the second base member can also be modified as appropriate.

INDUSTRIAL APPLICABILITY

According to the present invention, it is possible to obtain a semiconductor physical quantity sensor which can enhance detection accuracy.

The invention claimed is:
1. A semiconductor physical quantity sensor comprising:
a first base material;
an electrode formed on the first base material;
a diaphragm configured to bend in accordance with a physical quantity applied from the outside;
a second base material fixed to the first base material and supporting the diaphragm such that the diaphragm is opposed to the electrode with a space in between;
an insulator formed on a surface of the diaphragm, the surface being on the first base material side;
a through-hole penetrating the second base material to detect a capacitance between the diaphragm and the electrode, and
a wall portion to surround at least part of the through-hole and define the space and the through-hole, wherein the wall portion is formed in a gap between the insulator and the electrode facing each other in a thickness direction of the diaphragm.

2. The semiconductor physical quantity sensor according to claim 1, wherein the wall portion comprises a first projection projecting from the insulator toward the electrode, the first projection having an insulating property.

3. The semiconductor physical quantity sensor according to claim 2, wherein the first projection of the wall portion is brought into contact with the electrode.

4. The semiconductor physical quantity sensor according to claim 2, wherein the space and the through-hole communicate with each other at a tip end of the first projection of the wall portion.

5. The semiconductor physical quantity sensor according to claim 2, wherein at least part of a tip end of the first projection of the wall portion is housed inside a groove of the electrode.

6. The semiconductor physical quantity sensor according to claim 1, wherein the insulator is a silicon oxide film.

7. The semiconductor physical quantity sensor according to claim 1, wherein the insulator is a silicon nitride film.

8. The semiconductor physical quantity sensor according to claim 1, wherein the electrode is made of a metal material.

9. The semiconductor physical quantity sensor according to claim 8, wherein the electrode is formed by using at least one of materials including chromium, aluminum, a titanium-aluminum alloy, and an aluminum alloy.

10. The semiconductor physical quantity sensor according to claim 1, wherein the electrode comprises:
an electrode body opposed to the diaphragm; and
an extension portion extending to the outside of the space.

11. The semiconductor physical quantity sensor according to claim 10, wherein the extension portion is formed by using at least one of materials including chromium, aluminum, a titanium-aluminum alloy, and an aluminum alloy.

12. The semiconductor physical quantity sensor according to claim 10, wherein the electrode body is made of a material different from a material of the extension portion.

13. The semiconductor physical quantity sensor according to claim 10, wherein the extension portion is provided with an electrode pad made of a material containing aluminum.

14. The semiconductor physical quantity sensor according to claim 1, wherein the wall portion comprises a second projection projecting from the electrode toward the insulator, the second projection having a conductive property.

* * * * *